United States Patent [19]

Polyzoes

[11] 4,019,028
[45] Apr. 19, 1977

[54] PRINTING MACHINE WITH VARIABLE COUNTER CONTROL SYSTEM

[75] Inventor: Demetrios Polyzoes, Pittsford, N.Y.

[73] Assignee: Xerox Corporation, Stamford, Conn.

[22] Filed: Nov. 25, 1974

[21] Appl. No.: 526,652

Related U.S. Application Data

[63] Continuation of Ser. No. 343,067, March 20, 1973.

[52] U.S. Cl. .................. 235/92 SB; 235/92 CC; 235/92 R; 355/14; 235/92 PE
[51] Int. Cl.² ................................ H03K 21/30
[58] Field of Search ....... 235/92 SB, 92 ST, 92 CC, 235/92 PK, 92 CP, 92 PE, 92 CT, 98; 355/14

[56] References Cited
UNITED STATES PATENTS

| | | | |
|---|---|---|---|
| 3,358,570 | 12/1967 | Morrill | 235/92 SB |
| 3,453,418 | 7/1969 | Somlyody | 235/92 SB |
| 3,576,431 | 4/1971 | Zaccard | 235/92 SB |
| 3,636,319 | 1/1972 | Nixon | 235/92 ST |
| 3,655,281 | 4/1972 | Warren | 355/14 |
| 3,682,544 | 8/1972 | Glaser | 355/14 |
| 3,813,157 | 5/1974 | Fantozzi | 235/92 PE |

*Primary Examiner*—Gareth D. Shaw
*Assistant Examiner*—John P. Vandenburg
*Attorney, Agent, or Firm*—Earl T. Reichert

[57] ABSTRACT

A printing machine includes a counter control system which has a plurality of counters, the system being programmed for any one of various billing schemes by inserting an inexpensive field changeable billing code circuit board into the machine. The operations of the counters vary, depending upon which billing code circuit board is inserted, each counter recording information which is needed for the billing scheme selected.

2 Claims, 2 Drawing Figures

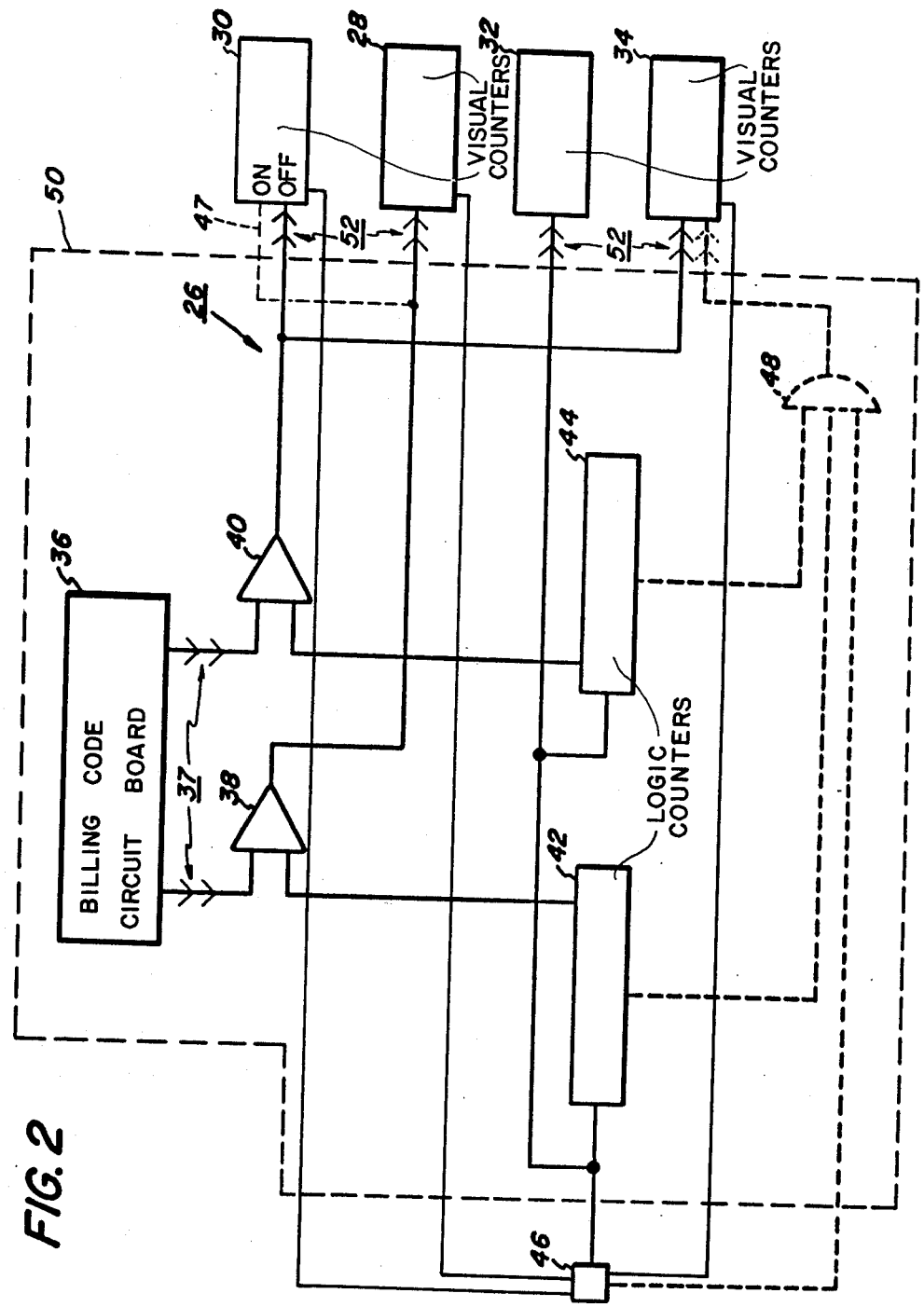

4,019,028

PRINTING MACHINE WITH VARIABLE COUNTER CONTROL SYSTEM

This is a continuation of U.S. patent application Ser. No. 343,067 filed Mar. 20, 1973.

BACKGROUND OF THE INVENTION

This invention relates to an improvement in a printing machine, (e.g. an electrostatic reproduction machine) but more particularly, to a printing machine having an improved flexible counter control system.

In the practice of xerography as described in U.S. Pat. No. 2,297,691 to Chester F. Carlson, a xerographic surface comprising a layer of photoconductive insulating material affixed to a conductive backing is used to support electrostatic images. In the usual method of carrying out the process, the xerographic plate is electrostatically charged uniformly over its surface and then exposed to a light pattern of the image being reproduced to thereby discharge the charge in the areas where light strikes the layer. The undischarged areas of the layer thus form as electrostatic charge pattern or latent image in conformity with the configuration of the original pattern.

The latent electrostatic image may then be developed by contacting it with a finely divided electrostatically attractable material, such as a resinous powder. The powder is held in the image areas by the electrostatic fields on the layer. Where the field is greatest, the greatest amount of material is deposited; and where the field is least, little or no material is deposited. Thus, a powder image is produced in conformity with the image of the original being reproduced. The powder is subsequently transferred to a sheet of paper or other transfer member and suitably affixed to thereby form a permanent copy.

The latest concept for electrostatic reproduction machines utilizes high speed flash exposure of a document, and a moving photoconductive material in the form of an endless belt which is continuously charged. Additionally, such reproduction machines are provided with a developing system which supplies toner particles in relatively large quantities for solid area coverage, such as a magnetic brush developing apparatus. Thus, after the belt passes the magnetic brush assembly for example, a xerographic powder image is formed on the belt which corresponds to the electrostatic latent image. This powder image is then transferred to a support surface (e.g. a sheet of paper) to which it is fused by a fusing assembly whereby the powder image is caused to adhere to the support surface permanently.

The latest reproduction machines are high speed machines which print copies at a rate substantially in excess of any previous machines. Because of this capability, and because the customer is sometimes charged on the basis of the copies made, it is highly desirable that such machines be flexible enough so that any one of various billing schemes can be used to assure that the customer can take advantage of the economies which are possible with such high speed machines. Thus, a counter control system is needed which can be easily programmed to operate so as to record whatever information is needed for the billing scheme selected. Such a control system also has the advantage of allowing the user of a machine to determine if the latter is being efficiently utilized. For example, the user can determine the ratio of running time to standby time, or what type of runs are being made on the machine, either of which affects machine wear.

SUMMARY OF THE INVENTION

The present invention is directed to a printing machine having a counter control system which is flexible enough to permit the operations of various counters to be varied so as to record the information needed. The example used herein to describe the use of the counter system is directed to a billing scheme.

A plurality of counters is used to record information, the operation of each of the counters varying depending upon how the systems programmed. An inexpensive field changeable billing code circuit board is inserted into the machine to program the system. The disclosed embodiment utilizes four counters, each of which is used to record various information depending upon which billing code circuit board is inserted. As an example, for one billing scheme which might be utilized and which will be discussed below, a first counter will count the number of times the machine was used for runs of 21 copies or greater, a second counter will count copies 1 through 5 and stop counting, a third counter will count copies 1 through 20 and stop counting, and the fourth counter will count the total number of copies. Each of these counters records information which is needed for this particular billing scheme in order to determine the cost to the customer for using the machine.

BRIEF DESCRIPTION OF THE DRAWINGS

FIG. 2 is a schematic circuit representation of an embodiment of the counter control circuit of the present invention.

DETAILED DESCRIPTION OF THE INVENTION

Figure 1:
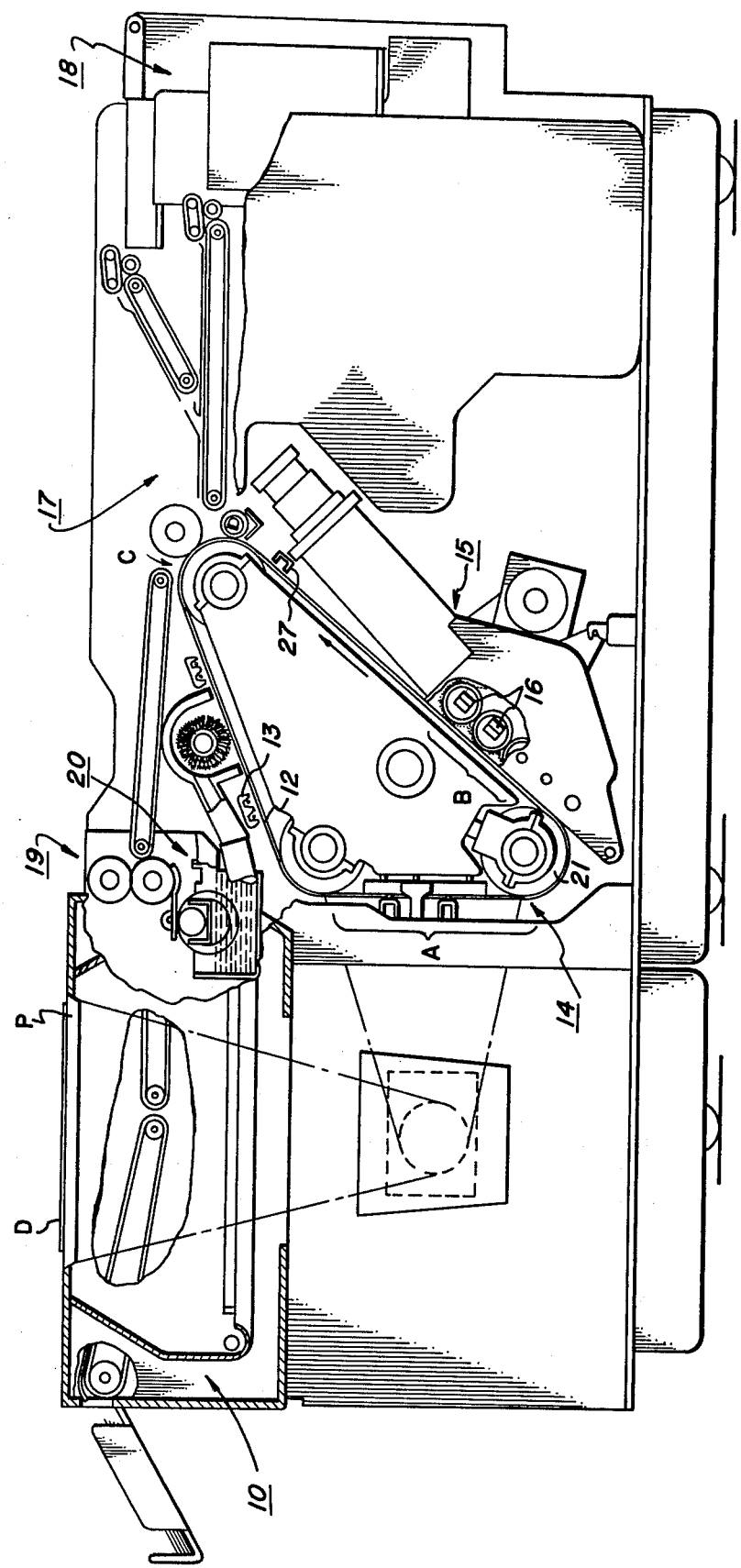
FIG. 1 is a schematic sectional view of an electrostatic reproduction machine embodying the principles of the invention.

For a general understanding of a reproduction machine in which the invention may be incorporated, reference is made to FIG. 1 in which the various system components for the machine are schematically illustrated. As in all electrostatic systems of the type illustrated, a light image of a document to be reproduced is projected onto the sensitized surface of a xerographic plate to form an electrostatic latent image thereon. Thereafter, the latent image is developed with an oppositely charged developing material to form a xerographic powder image, corresponding to the latent image on the plate surface. The powder image is then electrostatically transferred to a support to which it may be fused by a fusing device whereby the powder image is caused permanently to adhere to the support surface.

In the illustrated machine, an original document D to be copied is placed upon the transparent support platen P fixedly arranged in an illumination assembly generally indicated by the reference numeral 10, arranged at the left end of the machine; a platen cover (not shown) is then lowered onto the original D to cover the same. While upon the platen P, an illumination system flashes light rays upon the original thereby producing image rays corresponding to the informational areas on the original. The image rays are projected by means of an optical system for exposing the photosensitive surface of a xerographic plate in the form of a flexible photoconductive belt 12. The surface of the belt was made photosensitive by the previous step of uniformly charging the same by means of a corona generating device or corotron 13. In order to effect image processing, the belt 12 is arranged on a belt assembly generally indicated by the reference numeral 14.

The photoconductive belt assembly 14 is slideably mounted upon two support shafts, one of which is secured to the frame of the machine, and is adapted to drive a belt 12 in the direction of the arrow at a constant rate. During this movement of the belt, the reflected light image of an original on the platen is flashed upon the photoreceptor surface of the belt to produce electrostatic latent images thereon at an exposure station A.

As the belt surface continues its movement, the electrostatic image passes through a developing station B in which there is positioned a developer assembly generally indicated by the reference numeral 15, and which provides development of the electrostatic image by means of multiple brushes 16 as the same moves through the development zone.

The developed electrostatic image is transported by the belt to a transfer station C where a sheet of copy paper is moved between a transfer roller and the belt at a speed in synchronism with the moving belt in order to accomplish transfer of the developed image solely by an electrical bias on the transfer roller. There is provided at this station a sheet transport mechanism generally indicated at 17 adapted to transport sheets of paper from a paper handling mechanism generally indicated by the reference numeral 18 to the developed image on the belt at the station C.

After the developed image is transferred to the sheet, the latter is stripped from the belt 12 and conveyed into a fuser assembly indicated generally by the reference numeral 19 wherein the developed and transferred xerographic powder image on the sheet material is permanently affixed thereto. After each copy is thus produced, it is delivered via sheet transport mechanism 22 into an output tray 24.

Additional details regarding the subject electrostatic reproduction machine are set forth in a copending U.S. patent application assigned to the same assignee, U.S. Ser. No. 312,411. Although not specifically discussed herein, it is understood that the present invention may also be utilized in combination with a sorter or face-up tray as set forth in above mentioned copending application.

As stated above, it is highly desirable that a high speed reproduction machine be capable of being utilized with various billing schemes so that a customer being charged for the use of the machines on the basis of the copies made can take advantage of the economies offered by such a machine. To accomplish the same, the machine must have a counter control system which is flexible enough so that the operations of the counters can be varied so as to record the necessary information needed for a selected billing scheme. To vary the operations of the counters, an inexpensive field-changeable billing code circuit board is inserted into the machine to provide a program which causes the counters to record the necessary information.

Referring to FIG. 2, the counter control system 26 is set up so that counters 28, 30, 32, and 34 each record information needed for the selected billing scheme; each of these counters is an electro-mechanical counter which gives a visual indication of the count recorded. As used herein, a "run" indicates the total number of copies made of an original each time the "Start-Print" button of the reproduction machine is pushed. For example, if the original is placed upon platen P, and the reproduction machine is programmed to print 21 copies of an original, a run of 21 copies will be produced upon pushing the Start-Print button. In discussing the system 26, it will be assumed that it is desired that counter 28 count copies 1 through 5 of each run, that counter 30 count copies 1 through 20 of each run, that counter 32 count the total number of copies of each run, and that counter 34 count the number of runs that have exceeded 20 copies. Thus, "breakpoint No. 1" (BP1) would be 5 copies, and "breakpoint No. 2" (BP2) would be 20 copies.

Using the above assumption, a billing code circuit board 36 is selected for which BP1 is coded at 5 and BP2 is coded at 20; this circuit board 36 has a printed circuit on both sides thereof, the presence or absence of conductive paths defining a program which will cause the counters to record the desired information. Circuit board 36 is easily inserted into the machine by means of suitable mating connectors 37. As can be seen comparators 38 and 40 have at least two inputs, one of the inputs for each being from the circuit board 36, comparator 38 receiving its other input from logic counter 42, and comparator 40 receiving its other input from logic counter 44. Counters 42 and 44 may be any suitable logic counters such as flip-flops or shift registers.

Each time a copy is delivered into the output tray 24 (or sorter or face-up tray if used), it crosses an output sensor 46 (e.g., a switch or light beam) which sends an input to counters 32, 42, 44, counter 32 counting the total number of copies made. Counter 28 will register a count for each copy made up through 5 copies (BP1), at which time the input from counter 42 to comparator 38 will equal the coded input from the billing code circuit board 36 to thus stop counter 28. Likewise counter 30 will register a count for each copy made up through 20 and then stop counting. In this example, billing code circuit board 36 is coded so that when counter 30 stops counting, counter 35 begins and registers a single count to indicate a run beyond 20 copies (BP2) is being made.

Utilizing the information recorded by counters 28, 30, 32, and 34, it will be assumed that a billing scheme as follows is desired, where Δ signifies the change in a counter from one billing period to another:

Scheme 1
    Copies 1 through 5 at a  /copy
    Copies 6 through 20 at b  /copy
    Run length 21:
        Run charge of c  /no. of runs > 20
        1 through 50K at d  /copy
        50K + 1 through 100K at e  /copy
        100K + 1 to ∞ at f  /copy Counter Operation

| No. 34 | No. 28 | No. 30 | No. 32 |
|---|---|---|---|
| Counts 21st copy | Counts copies 1 – 5 | Counts copies 1 – 20 | Counts total |

Invoice
    A = Δ No. 28 − ( Δ No. 34 × 5)
    B = Δ No. 30 − Δ No. 28 − ( Δ No. 34 × 15)
    C = Δ No. 34
    D = Δ No. 32 − [Δ No. 30 − ( Δ No. 34 × 20)]

Billing Equation
    Total = a (A) + b (B) + c (C) + X

Where X = 
    d  (D) for 1 < D < 50K, or
    e  (D) for 50K < D ≤ 100K, or

-continued

| | |
|---|---|
| f | (D) for 100K < D |

Utilizing the above billing scheme, it will be assumed that the following runs were made during a billing period and that the machine was newly installed, and consequently all counters registered zero at the start:

| Run No. | Counter No. 32 | Counter No. 34 | Counter No. 28 | Counter No. 30 |
|---|---|---|---|---|
| 1 | 4 | 0 | 4 | 4 |
| 2 | 5 | 0 | 5 | 5 |
| 3 | 6 | 0 | 5 | 6 |
| 4 | 20 | 0 | 5 | 20 |
| 5 | 21 | 1 | 5 | 20 |
| 6 | 100 | 1 | 5 | 20 |
| 7 | 1 | 0 | 1 | 1 |
| Totals | 157 | 2 | 30 | 76 |

Thus, with the above runs, A = 20, B = 16, C = 2, and D = 121, and from these values the total cost based upon copies made can be calculated from the billing equation for the selected billing scheme.

Counter 34 can also be caused, by the appropriate circuitry on billing code circuit board 36 to count the number of times a run > BP1 was made on an original, to register a count for each original document copied on a job, or any combination of these three operations. It is understood that it is within the scope of the present invention to have counter 28 count each copy delivered through BP1, and have counter 30 count each copy delivered in excess of BP1 up through BP2 if desired. In this instance, counter 30 would be initiated by a signal through 47, and would be stopped via comparator 40, and there would be no "over-lap" between the two counters.

If it is desired that counter 34 register a count for each original document copied on a job, it can be arranged for the counter to register a count for the first copy delivered into the output tray 24, as will the counters 42 and 44 (see lower dotted line circuitry in FIG. 2). After the count is registered on counters 42 and 44, gate 48 prevents further counts from being registered on counter 34. At the completion of a run, counters 42 and 44 are cleared, by recognition that the platen cover is being lifted, or by information from an automatic document handler that a new original document is being copied.

Preferably, the circuitry of control system 26 is arranged to form a billing circuit board 50 which can be easily inserted into the machine by means of suitable mating connectors 52.

While the invention has been described with reference to the structure disclosed, it is not confined to the details set forth, but is intended to cover such modifications or changes as may come within the scope of the following claims.

What is claimed is:

1. In a reproduction machine of the type which produces and delivers a number of copies of an original to a receiving means during a run of a job, the improvement which comprises:

a. first means for counting the total number of copies of an original delivered to the receiving means, second means for counting each copy of an original up to a first predetermined number which is delivered to the receiving means, and third means for counting the number of runs that exceed a predetermined length, the first, second, and third counting means including a plurality of counters for presenting visual indications of the events counted, and b. means for enabling at least some of the counters in accordance with a predetermined program, a billing circuit board detachably connected to the enabling means by mating connectors for defining the predetermined program, and means for detecting when a copy has been deposited in the receiving means and for sending an input to the counters in accordance with the predetermined program.

2. In a reproduction machine of the type which produces and delivers a number of copies of an original to a receiving means during a run of a job, the improvement which comprises:

a. first means for counting the total number of copies of an original delivered to the receiving means, second means for counting each copy of an original up to a first predetermined number which is delivered to the receiving means, and means for counting each original copied on the job the first, second, and third counting means including a plurality of counters for presenting visual indications of the events counted, and b. means for enabling at least some of the counters in accordance with a predetermined program, a billing circuit board detachably connected to the enabling means by mating connectors for defining the predetermined program, and means for detecting when a copy has been deposited in the receiving means and for sending an input to the counters in accordance with the predetermined program.

* * * * *